United States Patent [19]

Pepper

[11] Patent Number: 4,728,901
[45] Date of Patent: Mar. 1, 1988

[54] POWER BUFFER CIRCUIT

[75] Inventor: Steven H. Pepper, Portland, Oreg.

[73] Assignee: Tektronix, Inc., Beaverton, Oreg.

[21] Appl. No.: 848,520

[22] Filed: Apr. 7, 1986

[51] Int. Cl.[4] .......................... H03F 1/34; G05F 1/40
[52] U.S. Cl. .................................. 330/260; 323/273;
                                              323/280; 330/300
[58] Field of Search ................. 330/85, 260, 300, 253;
                                    307/297, 475; 323/273, 280, 281

[56] References Cited

U.S. PATENT DOCUMENTS

| | | | |
|---|---|---|---|
| 3,244,963 | 4/1966 | Kreckel | 323/273 |
| 3,315,149 | 4/1967 | Strait et al. | 323/280 Y |
| 4,560,918 | 12/1985 | Callen | 323/273 |

FOREIGN PATENT DOCUMENTS

| | | | |
|---|---|---|---|
| 0053643 | 4/1977 | Japan | 330/260 |
| 46352 | 4/1979 | Japan | 323/273 |
| 106013 | 6/1984 | Japan | 323/273 |

OTHER PUBLICATIONS

Richardson, "New Op Amps And Applications," *New Electronics*, vol. 13, No. 12, Jun. 12, 1980, pp. 103, 104, 107.

Williams, "Voltage Following;" *Wireless World*, Sep. 1968, pp. 295-298.

*Primary Examiner*—James B. Mullins
*Attorney, Agent, or Firm*—Mark L. Becker; George T. Noe

[57] ABSTRACT

A power buffer circuit includes a power MOS device connected via a local feedback loop to a differential amplifier. The MOS device amplifies the power of an input signal to produce an output signal. The differential amplifier causes the output signal voltage to follow the input signal voltage by sensing a difference between the two voltages and generating in response a difference signal to the MOS device to change the output signal voltage level. The buffer circuit may be configured as a current source or a current sink that maintains unity voltage gain from the input to output signal. The power buffer circuit may be incorporated into a voltage regulator that maintains a remotely sensed output voltage substantially equal to a predetermined factor of a reference voltage via a second, outer feedback loop.

6 Claims, 6 Drawing Figures

POWER BUFFER CIRCUIT

BACKGROUND OF THE INVENTION

1. Field of the Invention

This invention relates to power buffer circuits for providing power gain to a signal while maintaining its voltage at unity gain and more particularly to such a circuit that combines the advantages of metal oxide semiconductor and bipolar power transistors without their separate drawbacks.

2. Description of the Prior Art

Power buffer circuits are intended to provide power gain to a signal while maintaining that signal at its initial voltage level. They find common application in voltage regulators to provide high current gain with a constant output voltage. Another application of such circuits is in audio amplifiers, where they maintain the voltage level of the input signal while amplifying the signal's power.

Two popular prior power buffer circuits are the bipolar transistor emitter follower and the metal oxide semiconductor field-effect transistor (MOSFET) source follower. The emitter follower provides an output voltage on the emitter that closely follows the input voltage, differing only by the voltage drop across a forward-biased base emitter junction. Power gain is provided by the collector current summing with the base or input current. The result is a power gain between the input (base) and output (emitter) signals with only a small difference in voltage levels between the two.

The emitter follower, however, has several major disadvantages. First, a bipolar transistor requires a relatively large device area to provide a significant current gain when approaching saturation. A number of smaller bipolar transistors can be cascaded together with a large power device such as in a Darlington pair to improve current gain, but such an arrangement demands even more area. A second disadvantage is the high collector-to-emitter saturation voltage or "head room" necessary to operate the transistor in its linear region. This voltage difference multiplied by the high current flow through the transistor causes the emitter follower to dissipate considerable power.

A power MOS device configured as a source follower, on the other hand does not have these drawbacks. It provides nearly infinite current gain. For the same device area, it responds much faster to changing current demands than the Darlington emitter follower. Moreover, its "head room" or voltage difference between drain and source can be made arbitrarily small, limited only by die area, because of its resistive saturation characteristics. But the source follower suffers from poor DC voltage gain. The output voltage at its source cannot accurately follow the input voltage at its gate at DC or low frequencies because of low transconductance in the ohmic saturation region. In such cases, a large voltage difference is required between the gate voltage and the source voltage to produce the desired current gain.

A common technique to compensate for the DC gain limitation of the source follower is to tie the input voltage to the output voltage through a global feedback loop. Because of variations in the characteristics of MOS devices and variations in the device's response to changing drain voltage, however, this technique is largely ineffective. Cumulative gain variation can easily exceed a factor of 10, making prediction of stability and bandwidth nearly impossible at the device's upper frequency limits. The guarantee of stability requires drastically reducing the power bandwidth to far below the device's capability.

SUMMARY OF THE INVENTION

Therefore, an object of the invention is to provide a power buffer circuit that has better current handling capacity, higher gain, faster response, and a lower "head room" than prior power buffer circuits.

A second object of the invention is to provide such a circuit that utilizes a power MOS device with a local feedback loop to cause the output voltage of the circuit to follow the input voltage to the circuit.

Another object of the invention is to combine in such a circuit the advantages of the emitter follower and the power MOS transistor devices while avoiding their separate drawbacks.

Still another object of the invention is to incorporate such a power buffer circuit into a voltage regulator that is stable over a wide bandwidth.

To achieve these objects, a power buffer circuit includes an amplifying means and an adjusting means connected in local feedback relation directly to the amplifying means. The amplifying means amplifies the power of an input signal to produce an output signal. The adjusting means adjusts the amplifying means to cause the voltage level of the output signal to follow the voltage level of the input signal. The adjusting means samples the output signal voltage and the input signal voltage to sense a difference between the signal voltages. In response to a difference, the adjusting means signals the amplifying means to change the voltage level of the output signal.

In a preferred embodiment, the amplifying means comprises a power transistor such as a MOS device, and the adjusting means comprises a differential amplifier such as a bipolar transistor. The differential amplifier senses a difference between the voltage levels of the input and output signals and generates in response to a difference an amplified difference signal that is transmitted to the power transistor. This difference signal causes the power transistor to change the voltage level of the output signal by changing current through the power transistor.

In one aspect of the invention, the power buffer circuit may be incorporated into a voltage regulator that regulates the voltage applied to load circuitry. The regulator includes a means for sensing the output voltage level remotely throughout the load circuitry and a regulating means such as a error amplifier for comparing the remotely sensed output voltage level to a reference voltage level. The error amplifier generates in response to a difference between the output and reference voltage levels an error signal that becomes the input signal to the power buffer circuit. This input signal is also compared to the output voltage, but at the source of the power transistor. The regulator thus has a nested, two loop feedback arrangement. The inner feedback loop extends and stabilizes the gain-bandwidth of the power transistor while the outer feedback loop senses the output voltage at remote circuit locations.

The foregoing and other objects, features, and advantages of the invention will become more apparent from the following detailed description of a preferred embodiment which proceeds with reference to the accompanying drawings.

DETAILED DESCRIPTION

Figure 1:
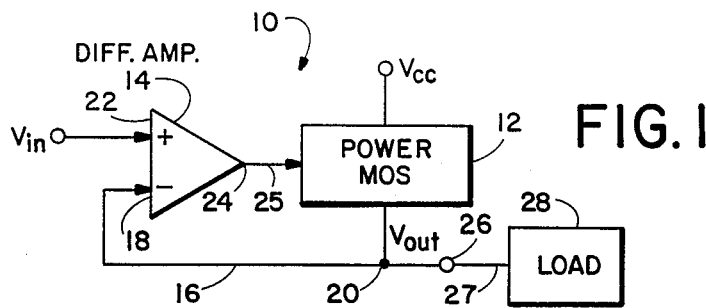
FIG. 1 is a block diagram of a power buffer circuit according to the invention.

A block diagram of a power buffer circuit 10 according to the invention is shown in FIG. 1. Circuit 10 includes an amplifying means such as a power MOS device 12 for amplifying the power of an input signal $V_{in}$ to produce an output signal $V_{out}$. The circuit 10 also includes an adjusting means such as a differential amplifier 14 connected to the device 12 in local feedback relation for adjusting the MOS device to cause the voltage level of the output signal to follow the voltage level of the input signal. A local feedback loop between the amplifier 14 and the MOS device 12 is completed by a signal path 16, which connects the inverting input terminal 18 of the differential amplifier to the output of the MOS device at a node 20. The noninverting input terminal 22 of the amplifier 14 senses the input signal voltage. The differential amplifier samples a difference between the two voltage levels and generates in response a difference signal at its output terminal 24. The difference signal is transmitted through a path 25 to the MOS device 12. The value of the difference signal causes the MOS device 12 to change the voltage level of $V_{out}$ by modulating the channel resistance of the device to vary the current therethrough. This negative feedback of $V_{out}$ to the differential amplifier 14 enables the circuit 10 to continuously compensate for changes to $V_{in}$, $V_{out}$, the voltage supply $V_{cc}$, or the device parameters.

An example illustrates how the power buffer circuit 10 provides power gain to an input signal. Assume the power of the output signal is transmitted via a terminal 26 and a path 27 to a connected load 28. Ideally the voltage of the output signal should be constant as the resistance of the load 28 varies or $V_{cc}$ fluctuates. In reality, however, a decreasing resistive load draws additional current from the circuit 10 and lowers $V_{out}$ as $V_{out}$ divides across the internal resistance of the MOS device 12 and the resistance of the load 28. This change in $V_{out}$ is transmitted via the path 16 to the inverting input terminal 18 of the differential amplifier 14, where $V_{out}$ is compared with $V_{in}$ sensed at the noninverting input terminal 22. The difference between the two voltage levels is sensed by the differential amplifier 14, which generates at its output terminal 24 a difference signal proportional to the voltage difference between $V_{in}$ and $V_{out}$. With $V_{out}$ less than $V_{in}$, the difference signal raises via the path 25 the voltage to the power MOS device 12, thereby decreasing the channel resistance of the device and increasing the current from $V_{cc}$ to the load 28. The increased current raises the level of $V_{out}$ until $V_{out}$ again equals $V_{in}$. If $V_{cc}$ fluctuates to increase or decrease $V_{out}$, the same circuit response occurs.

Figure 2:
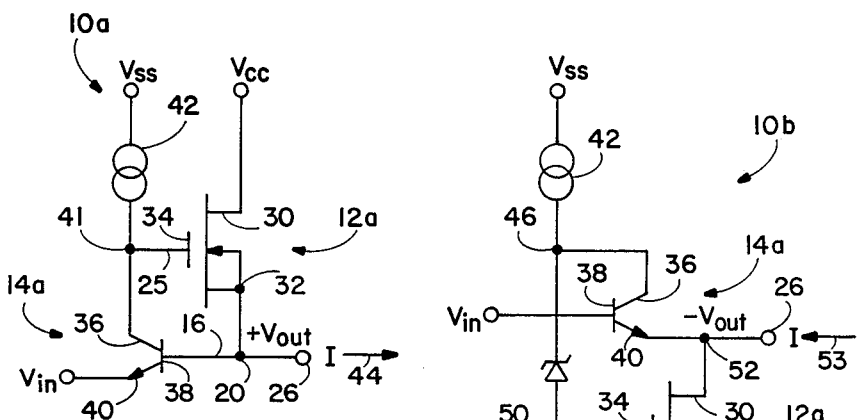
FIG. 2 is a first embodiment of the power buffer circuit of FIG. 1.

A first detailed embodiment of the power buffer circuit 10 is shown in FIG. 2 as the circuit 10a, with the same reference numerals used for similar elements in FIG. 1. The device 12 comprises an n-channel enhancement-mode power MOSFET 12a having a drain 30, a source 32, and a gate 34. An unregulated voltage supply $V_{cc}$ for the output terminal 26 is connected to the drain 30. N-channel depletion and p-channel enhancement and depletion MOSFETS may, of course, also be used with appropriate changes to the circuit 10a. The differential amplifier 14 comprises a bipolar transistor 14a having a collector 36, a base 38 (equivalent to the inverting input terminal 18), and an emitter 40 (equivalent to the noninverting input terminal 22). The collector 36 is connected to the gate 34 via a common node 41 and the path 25. The source 32 is connected to the base 38 via the node 20 and path 16. $V_{out}$ appears as an output voltage at the source 32, which also is connected to the terminal 26 via the node 20. $V_{in}$ is received at the emitter 40. A current source 42 for the bipolar transistor 14a is connected to the collector 36 via the node 41.

These interconnections of the MOSFET 12a and bipolar transistor 14a enable the circuit 10a to source current as indicated by the current arrow 44 while maintaining substantially unity voltage gain from input to output signal. $V_{in}$ and $V_{out}$ differ by the nearly constant voltage drop across the base-emitter junction of bipolar transistor 14a. If $V_{cc}$ fluctuates or the resistance of the load 28 changes, $V_{out}$ will change temporarily, but that change is signaled to the MOSFET 12a through the feedback path 16 and the transistor 14a to restore $V_{out}$ to its original level with respect to $V_{in}$. For example, if $V_{cc}$ drops, $V_{out}$ will drop, causing the voltage difference between $V_{in}$ and $V_{out}$ to decrease. This decrease causes the voltage drop across the base-emitter junction to decrease and hence the collector current drawn through the transistor 14a to decrease. Current from the constant current source is then diverted to the gate 34, charging its gate capacitance and thereby causing the gate voltage to rise. The rising gate voltage decreases the channel resistance in the MOSFET 12a and increases the current through the MOSFET 12a into the connected load 28. The increased current in turn causes $V_{out}$ to rise to its former level. The voltage drop across the base-emitter junction increases, causing the collector current to increase to its former level. The voltage on gate 34, however, remains at its new level because of the stored charge of the gate capacitance. The net result is a higher gate voltage.

Conversely, if $V_{out}$ rises because of an increase in the resistance of the load 28, the voltage drop across the base-emitter junction of the transistor 14a will increase, causing the collector current to increase in response. Given the constant current from the source 42, the additional current into the collector 36 results from charge being drawn off the gate capacitance through node 41. As a result, the gate voltage falls. The channel resistance of the MOSFET 12a increases and thereby the current through the MOSFET 12a into the load 28 decreases. $V_{out}$ will fall to its former level. The net result is a lower gate voltage.

Figure 3:
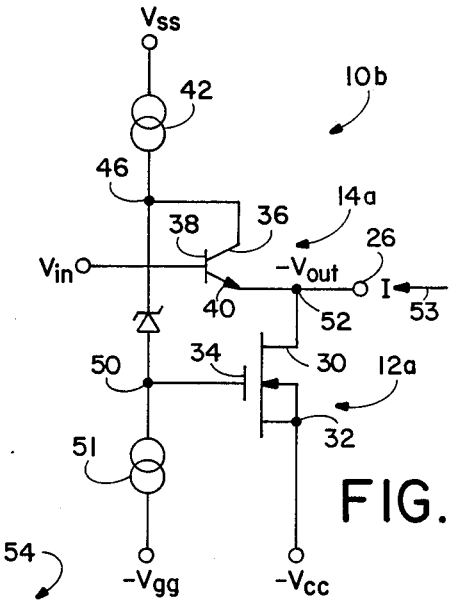
FIG. 3 is a second embodiment of the power buffer circuit of FIG. 1.

Circuit 10b shown in FIG. 3 is a second detailed embodiment of the general power buffer circuit 10. An unregulated voltage supply $-V_{cc}$ is connected to the source 32. The current source 42 is connected to the collector 36 at a node 46. Connected between node 46 and the gate 34 is a means for shifting the level of the collector voltage downward, such as a Zener diode 48.

The cathode end of the diode 48 is connected to the node 46 and the anode end is connected to a node 50. Also connected to the node 50 are the gate 34 and a second current source 51. The second current source biases the Zener diode 48 to maintain its breakdown voltage from node 46 to node 50 during circuit operation. The gate voltage then is always lower than the collector voltage by the constant voltage drop across the Zener diode 48. This voltage drop is chosen to allow the gate-to-source voltage to drop to zero, permitting cutoff of the current through MOSFET 12a at the highest expected magnitude of $-V_{cc}$. $V_{in}$ is sensed at the base 38 (equivalent to the noninverting input terminal 22). The emitter 40 (equivalent to the inverting input terminal 18) and the drain 30 are tied together at a node 52 via feedback path 16. $-V_{out}$ appears as an output voltage at the drain 30, which also is connected to the terminal 26 via the node 52.

The interconnections of the MOSFET 12a and bipolar transistor 14a enable the circuit 10b to sink current as indicated by arrow 53 while maintaining substantially unity voltage gain from input to output signal. If the load resistance increases, for example, $-V_{out}$ will initially fall to a lower level, causing the voltage drop across the base-emitter junction of 14a to increase. In response, the collector current increases, diverting current from the current source 42 away from the gate 34. The collector voltage is shifted downward through the diode 48 to the gate 34, whose capacitance loses charge and the gate-to-source voltage drops. The lower gate voltage increases the channel resistance and decreases the current into the MOSFET 12a from the load 28. $-V_{out}$ then rises to its former level. The net result is a lower gate voltage.

Conversely, a decrease in the load 28 resistance will initially raise $V_{out}$, causing the gate voltage to rise. The MOSFET 12a responds by decreasing its channel resistance and sinking more current to lower $V_{out}$.

Both circuits 10a and 10b demonstrate the advantages of the invention over prior circuits. The "head room" in the MOS device 12 such as a MOSFET 12a can be lower than in an emitter follower. Yet the voltage difference between $V_{in}$ and $v_{out}$ in circuits 10a, 10b is more constant than in a conventional source follower operating at low frequencies.

Figure 4:
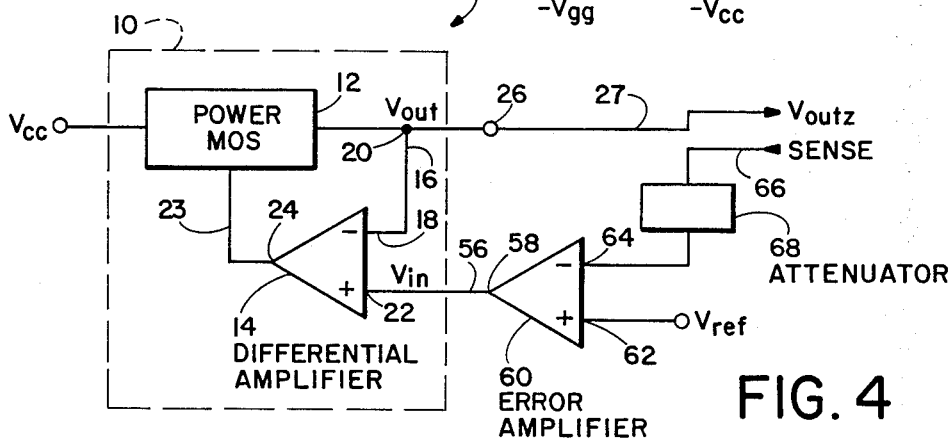
FIG. 4 is a block diagram of a voltage regulator incorporating the power buffer circuit of FIG. 1.

The power buffer circuit 10 may be incorporated into any number of circuits requiring a current source or sink with a constant output signal voltage. One such circuit is a voltage regulator which maintains a constant output voltage relative to a reference voltage, thereby allowing the voltage supply for the regulator to fluctuate. Referring to FIG. 4, a block diagram of a voltage regulator 54 is shown. A power buffer circuit 10 within the regulator 54 is outlined in dashed lines. The input signal voltage $V_{in}$ is transmitted to the noninverting input terminal 22 via a path 56 from the output terminal 58 of a regulating means such as an error amplifier 60. The error amplifier 60 has a noninverting input terminal 62 that is connected to a reference voltage source $V_{ref}$. The inverting input terminal 64 of the amplifier 60 is connected to a voltage sense line 66 through an optional voltage attenuator 68. The error amplifier 60, sense line 66, and attenuator 68 form part of a second, outer feedback loop for the regulator 54. Sense line 66 senses an output signal voltage $V_{out2}$ at a sense point remote from the power MOS device 12 and transmits that sensed voltage through the attenuator 68 to the error amplifier 60. The amplifier 60 compares $V_{out2}$, properly attenuated, with $V_{ref}$ and generates in response an error signal voltage that forms the input signal voltage $V_{in}$ to the differential amplifier 14. Amplifier 14 senses a difference between the error signal and $V_{out}$ appearing at the node 20 and generates in response the difference signal that is transmitted to the MOS device 12. The regulator 54 thus has a nested, two loop feedback arrangement. The inner feedback loop of the power buffer circuit 10 extends and stabilizes the gain-bandwidth of the device 12. Fluctuations in the line voltage supply $V_{cc}$ have little effect on $V_{out}$ so long as $V_{cc}$ exceeds $V_{out}$. The regulator 54 also responds quickly with excellent stability to transients in the load 28 because of the short length of the feedback path 16. The outer, slower feedback loop, on the other hand, senses $V_{out2}$ at the voltage sense point, so that voltage drops between the regulator 54 and other circuit locations where $V_{out2}$ is required are compensated for.

Figure 5:
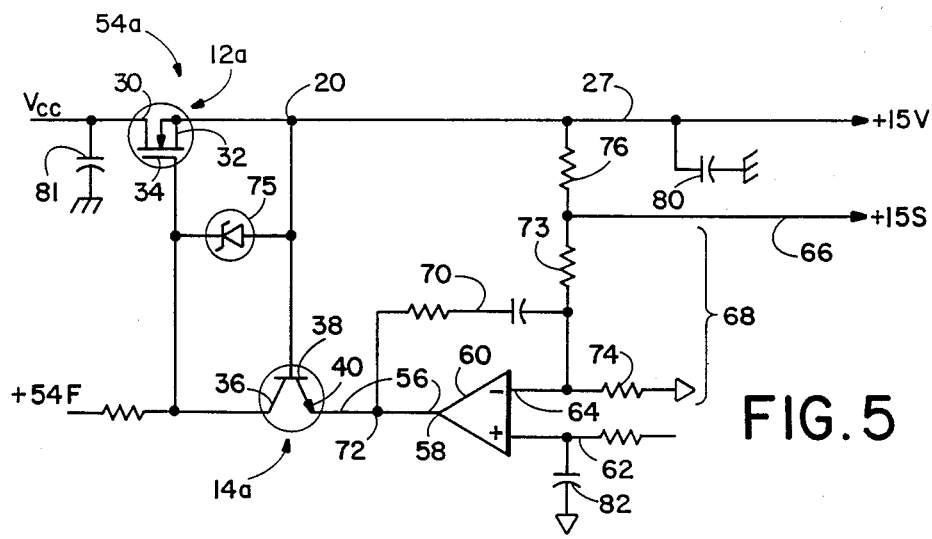
FIG. 5 is a first embodiment of the voltage regulator of FIG. 4.

A first detailed embodiment of a voltage regulator 54 according to the invention is shown in FIG. 5 as regulator 54a which incorporates circuit 10a. The path 56 from output terminal 58 of the error amplifier 60, the emitter 40 of the transistor 14a and the inverting input terminal 64 via a feedback path 70 all connect at a node 72. The path 70 contains resistive and capacitive elements to control the stability and bandwidth of the outer, global feedback loop. $V_{ref}$ is applied to the noninverting input terminal 62. The sense line 66 is connected to the inverting input terminal 64 through the attenuator 68 which comprises a voltage divider network of resistors 73 and 74. Several other circuit components are shown that have been added for circuit protection and for filtering of noise. A Zener diode 75 between the gate 34 and source 32 limits the gate-to-source voltage difference. A resistor 76 is connected between the sense line 66 and the load path 26 to maintain stable operation of the regulator 54a in the event of an open sense line 66. Capacitors 80 and 81 provide known, stable impedances for both the regulator 54a and the load 28 for frequencies near and above the regulator bandwidth. Capacitor 82 connected to the noninverting input terminal 62 filters RF noise that otherwise may interfere with the operation of the regulator 54a.

The interconnections between the components of the regulator 54a enable it to source current through the load path 26 while maintaining the sensed output voltage $V_{out2}$ substantially equal to a predetermined factor of the reference voltage. $V_{out2}$ is sensed by the sense line 66 at a sense point remote from the MOSFET 12a and transmitted to the inverting input terminal 64 of the error amplifier 60 after appropriate attenuation. The error amplifier 60 senses a difference between the attenuated $V_{out2}$ and the reference voltage $V_{ref}$ levels and generates in response an error signal at its output terminal 58. This error signal is routed via path 56 to the emitter 40 to form the input voltage $V_{in}$. $V_{in}$ is then compared to $V_{out}$ appearing at the node 20 to change the voltage on gate 34 accordingly. $V_{out2}$ thus follows the $V_{ref}$. The voltage supply $V_{cc}$ to the regulator 54a can fluctuate to any level so long as it exceeds the "head room" required by the MOSFET 12a.

Figure 6:
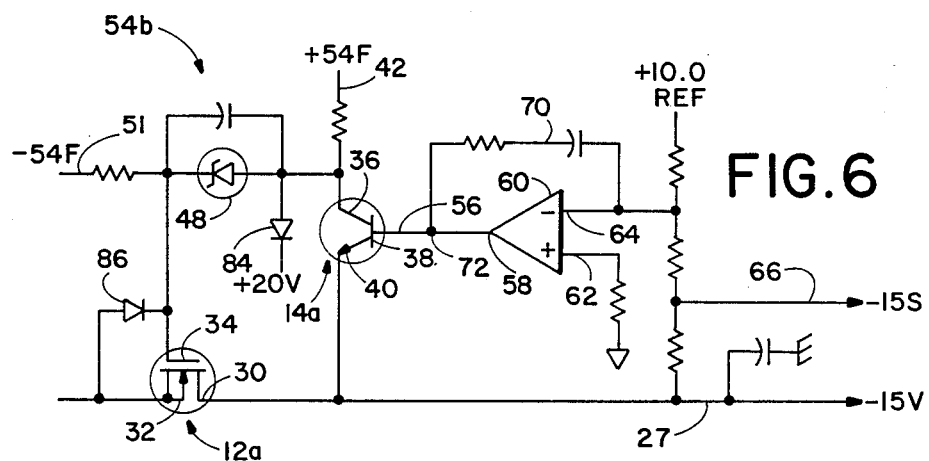
FIG. 6 is a second embodiment of the voltage regulator of FIG. 4.

A second detailed embodiment of a regulator 54 is shown in FIG. 6 as regulator 54b. *The design of the regulator 54b is similar to that of 54a except for the following differences.* The reference voltage $V_{ref}$ and sensed output voltage $V_{out2}$ are summed at the inverting input terminal 64 of the error amplifier 60 and are compared with a zero reference voltage transmitted through a resistor 82 to the noninverting input terminal 62. Path 56 connects the output terminal 58 of amplifier 60 to the base 38 to transmit an error signal that forms $V_{in}$. Zener diode 48 is connected between the collector 36 and the gate 34 to shift the voltage at the collector downward as it is transmitted to the gate. The regulator 54b also contains a protective diode 84 connected to the collector 36 to limit the maximum gate-to-source voltage of the MOSFET 12. A protective diode 86 limits the minimum gate-to-source voltage difference.

The interconnections between the components of the regulator 54b enable it to sink current through the load path 26 while maintaining the sensed output voltage $V_{out2}$ substantially equal to a predetermined factor of the reference voltage $V_{ref}$. Changes in $V_{out2}$ are detected by the amplifier 60 and transmitted through the regulator 54b as described above to change the current drawn into the source 32 from the load 28.

Having illustrated and described the principles of the invention in a preferred embodiment, it should be apparent to those skilled in the art that the invention can be modified in arrangement and detail without departing from such principles.

I claim all modifications coming within the spirit and scope of the following claims

1. A power buffer circuit for providing current gain to an input signal while maintaining substantially unity voltage gain between the input and output signals, comprising:
   an MOS device haivng a gate, drain, and source, the output signal appearing at the source; and
   a bipolar transistor having its emitter for sensing the input voltage, its base connected directly to the source to sense the output voltage and its collector coupled to the gate,
   the bipolar transistor setting the voltage on the gate in response to a difference between the input and output voltages to cause the output voltage to follow the input voltage by varying the current through the MOS device.

2. A power buffer circuit for providing current gain to an input signal while maintaining substantially unity voltage gain between the input signals, comprising:
   an MOS device having a gate, drain, and source, the output signal appearing at the drain; and
   a bipolar transistor having its base for sensing the input voltage, its emitter connected directly to the drain to sense the output voltage and its collector coupled to the gate,
   the bipolar transistor setting the voltage on the gate in response to a difference between the input and output voltages to cause the output voltage to follow the input voltage by varying the current through the MOS device.

3. The power buffer circuit of claim 2 including a voltage level shifting means connected between the collector and the gate for level shifting the gate voltage.

4. A voltage regulator for regulating a voltage supply to provide an out voltage that follows a reference voltage, comprising:
   a metal oxide semiconductor device for amplifying to power of an input signal to produce an output signal;
   a bipolar transistor directly connected to the MOS device in feedback relation for adjusting the metal oxide semiconductor device to cause the output signal voltage to follow the input signal voltage, the transistor sampling the output signal voltage and the input signal voltage to sense a difference beteen the signal voltages and in response to such a difference signaling the MOS device to change the output voltage;
   sensing means for sensing the output signal voltage remote from the amplifying means; and
   a differential amplifer for comparing the reference voltage to the remotely sensed output voltage and generating in response an error signal that forms the input signal to the bipolar transistor,
   the remotely sensed output voltage level thereby maintained substantially equal to a predetermined factor of the reference voltage level while the level of the voltage supply is allowed to fluctuate.

5. The voltage regulator of claim 4 in which the MOS device has a gate, drain, and source and the bipolar transistor has a colector, base, and emitter, the voltage supply connected to the drain, the source connected to the base, the gate connected to the collector, and the emitter receiving the error signal from the differential amplifier.

6. The voltage regulator of claim 4 including a Zener diode, the MOS device having a gate, drain, and source and the bipolar transistor having a collector, base, and emitter, the voltage supply connected to the source, the drain connected to the emitter, the gate connected to the collector, and the base receiving the errro signal from the differential amplifier, the Zener diode connected between the collector and the gate to level shift the gate voltage.

* * * * *